United States Patent
Allen et al.

(10) Patent No.: US 10,056,513 B2
(45) Date of Patent: Aug. 21, 2018

(54) APPARATUS AND METHOD OF FORMING AN APPARATUS COMPRISING A TWO DIMENSIONAL MATERIAL

(71) Applicant: Nokia Technologies Oy, Espoo (FI)

(72) Inventors: Mark Allen, Great Cambourne (GB); Richard White, Cambridge (GB); Piers Andrew, Cambridge (GB)

(73) Assignee: Nokia Technologies Oy, Espoo (FI)

(*) Notice: Subject to any disclaimer, the term of this patent is extended or adjusted under 35 U.S.C. 154(b) by 60 days.

(21) Appl. No.: 15/427,465

(22) Filed: Feb. 8, 2017

(65) Prior Publication Data
US 2017/0236957 A1 Aug. 17, 2017

(30) Foreign Application Priority Data

Feb. 12, 2016 (EP) .................................. 16155439

(51) Int. Cl.
| | |
|---|---|
| *H01L 31/0352* | (2006.01) |
| *G01T 1/20* | (2006.01) |
| *H01L 31/112* | (2006.01) |
| *H01L 31/028* | (2006.01) |
| *H01L 31/18* | (2006.01) |
| *H01L 31/0203* | (2014.01) |

(Continued)

(52) U.S. Cl.
CPC .... *H01L 31/035218* (2013.01); *G01T 1/2006* (2013.01); *G01T 1/208* (2013.01); *G01T 1/2018* (2013.01); *H01L 31/0203* (2013.01); *H01L 31/028* (2013.01); *H01L 31/022408* (2013.01); *H01L 31/1129* (2013.01); *H01L 31/1804* (2013.01)

(58) Field of Classification Search
CPC .......... H01L 31/035218; G01T 1/2006; G01T 1/208; G01T 1/2018
See application file for complete search history.

(56) References Cited

U.S. PATENT DOCUMENTS

| | | |
|---|---|---|
| 6,288,325 B1 | 9/2001 | Jansen et al. |
| 8,384,007 B2 | 2/2013 | Yu et al. |

(Continued)

FOREIGN PATENT DOCUMENTS

| | | |
|---|---|---|
| EP | 1310999 A2 | 5/2003 |
| EP | 2341542 A2 | 7/2011 |

(Continued)

OTHER PUBLICATIONS

Nagashio et al., "DOS-Limited Contact Resistance in Graphene FETs", Appl. Phys., Vo. 50, Apr. 2011, pp. 1-9.

(Continued)

*Primary Examiner* — Jose R Diaz
(74) *Attorney, Agent, or Firm* — Nokia Technologies Oy

(57) ABSTRACT

A method and apparatus, the method comprising: forming first electrode portions on a substrate; providing a sheet of two dimensional material overlaying at least part of the first electrode portions; forming second electrode portions on a superstrate; positioning the superstrate overlaying the substrate so that the second electrode portions are aligned with the first electrode portions; and laminating the substrate and the superstrate together so that the sheet of two dimensional material is positioned between the aligned first electrode portions and the second electrode portions.

20 Claims, 8 Drawing Sheets

(51) Int. Cl.
H01L 31/0224 (2006.01)
G01T 1/208 (2006.01)

(56) References Cited

U.S. PATENT DOCUMENTS

| | | | |
|---|---|---|---|
| 8,410,474 | B2 | 4/2013 | Okai et al. |
| 8,872,159 | B2 | 10/2014 | Kub et al. |
| 8,895,417 | B2 | 11/2014 | Afzali-Ardakani et al. |
| 2003/0134460 | A1 | 7/2003 | Forbes et al. |
| 2006/0071148 | A1 | 4/2006 | Bock |
| 2007/0057144 | A1 | 3/2007 | Asano |
| 2010/0320391 | A1* | 12/2010 | Antonuk ............ H01L 27/1462 250/366 |
| 2011/0284818 | A1 | 11/2011 | Avouris et al. |
| 2012/0001761 | A1 | 1/2012 | Voutilainen et al. |
| 2013/0049738 | A1 | 2/2013 | Sargent |
| 2013/0248823 | A1 | 9/2013 | Bol et al. |
| 2013/0334579 | A1 | 12/2013 | Accardi et al. |
| 2014/0077161 | A1 | 3/2014 | Duan et al. |
| 2014/0150859 | A1 | 6/2014 | Zakhidov et al. |
| 2014/0263945 | A1 | 9/2014 | Huang et al. |
| 2014/0332757 | A1 | 11/2014 | Avouris et al. |
| 2015/0137088 | A1 | 5/2015 | Simon et al. |

FOREIGN PATENT DOCUMENTS

| | | | |
|---|---|---|---|
| EP | 2705357 | A1 | 3/2014 |
| GB | 2473696 | A | 3/2011 |
| WO | 2004/109807 | A2 | 12/2004 |
| WO | 2009/085351 | A2 | 7/2009 |
| WO | 2009/099259 | A1 | 8/2009 |
| WO | 2009/156419 | A1 | 12/2009 |
| WO | 2011/161305 | A1 | 12/2011 |
| WO | 2012/145247 | A1 | 10/2012 |
| WO | 2012/150884 | A1 | 11/2012 |
| WO | 2013/085715 | A1 | 6/2013 |
| WO | 2015/021479 | A1 | 2/2015 |

OTHER PUBLICATIONS

Mesgarzadeh et al., "A Low-Noise Readout Circuit in 0.35-μm CMOS for Low-Cost Uncooled FPA Infrared Network Camera", Proc. SPIE, vol. 7298, May 6, 2009, pp. 72982F-1-72982F-8.
Karim et al., "Amorphous Silicon Active Pixel Sensor Readout Circuit for Digital Imaging", IEEE Transactions on Electron Devices, vol. 50, No. 1, Jan. 2003, pp. 200-208.
Maria, "Reducing Contact Resistance in Graphene Devices", Thesis, Jun. 4, 2014, 39 pages.
Furumiya et al., "High-Sensitivity and No-Crosstalk Pixel Technology for Embedded CMOS Image Sensor", IEEE Transactions on Electron Devices, vol. 48, No. 10, Oct. 2001, pp. 2221-2227.
Sharma et al., "Pixel Scale Optical Sample and Hold Circuit Integrated With Multi-Technology FPGA", 48th Midwest Symposium on Circuits and Systems, Aug. 7-10, 2005, pp. 1290-1293.
Krach et al., "A Switch for Epitaxial Graphene Electronics: Utilizing the Silicon Carbide Substrate as Transistor Channel", Applied Physics Letters, 2012, pp. 122102-1-122102-3.
Roudsari et al., "High-Gain Multiple-Gate Photodetector With Nanowires in the Channel", IEEE Electron Device Letters, vol. 32, No. 3, Mar. 2011, pp. 357-359.
Konstantatos et al., "Hybrid Graphene-Quantum Dot Phototransistors With Ultrahigh Gain", Nature Nanotechnology, vol. 7, Jun. 2012, pp. 363-368.
Rauch, "Spectral Enhancement OfOrganic Photodetectors", KIT Scientific publishibg, Jun. 24, 2014, 246 Pages.
"X-Ray Mass Attenuation Coefficients", NIST, Retrieved on Apr. 6, 2017, Webpage available at : http://physics.nist.gov/PhysRefData/XrayMassCoef/chap2.html.
"New Nanowire Transistors May Help Keep Moore's Law alive", Phys.org, Retrieved on Apr. 6, 2017, Webpage available at : https://phys.org/news/2013-05-nanowire-transistors-law-alive.html.
"X-Ray Radiation Window with Carbon Nanotube Frame", Ideas, Inventions and Innovations, Retrieved on Apr. 6, 2017, Webpage available at : http://www.ineffableisland.com/2010/07/x-ray-radiation-window-with-carbon.html.
Wan et al., "Semiconducting Oxide Nanowires: Growth, Doping and Device Applications", Nanowires—Implementations and Applications, Jul. 18, 2011, pp. 59-98.
Isacsson et al., "Parametric Resonances in Electrostatically Interacting Carbon Nanotube Arrays", Physical Review B, Apr. 14, 2009, pp. 165418-1-165418-11.
Extended European Search Report received for corresponding European Patent Application No. 15159721.8, dated Oct. 8, 2015, 11 pages.
Mueller et al., "Graphene Photodetectors for High-Speed Optical Communications", Nature Photonics, vol. 4, May, 2010, pp. 297-301.
Zhu et al., "An Overview of the Engineered Graphene Nanostructures and Nanocomposites", RSC Advances, No. 45, 2013, pp. 22790-22824.
"Eutectic Bonding", Wikipedia, Retrieved on Apr. 7, 2017, Webpage available at : https://en.wikipedia.org/wiki/Eutectic_banding.
Extended European Search Report received for corresponding European Patent Application No. 15170737.9, dated Dec. 8, 2015, 12 pages.
"NANOGe", Nanoge Liking the nano generation, Retrieved on Apr. 4, 2017, Webpage available at : http://www.nanoge.org/.
Heo et al., "Stable Semi-Transparent CH3NH3PbI3 Planar Sandwich Solar Cells", Energy & Environmental Science, Aug. 14, 2015, 6 pages.
International Search Report and Written Opinion received for corresponding Patent Cooperation Treaty Application No. PCT/FI2016/050128, dated Jun. 8, 2016, 17 pages.
International Search Report and Written Opinion received for corresponding Patent Cooperation Treaty Application No. PCT/FI2016/050329, dated Aug. 9, 2016, 17 pages.
Extended European Search Report received for corresponding European Patent Application No. 16155439.9, dated Aug. 31, 2016, 6 pages.

* cited by examiner

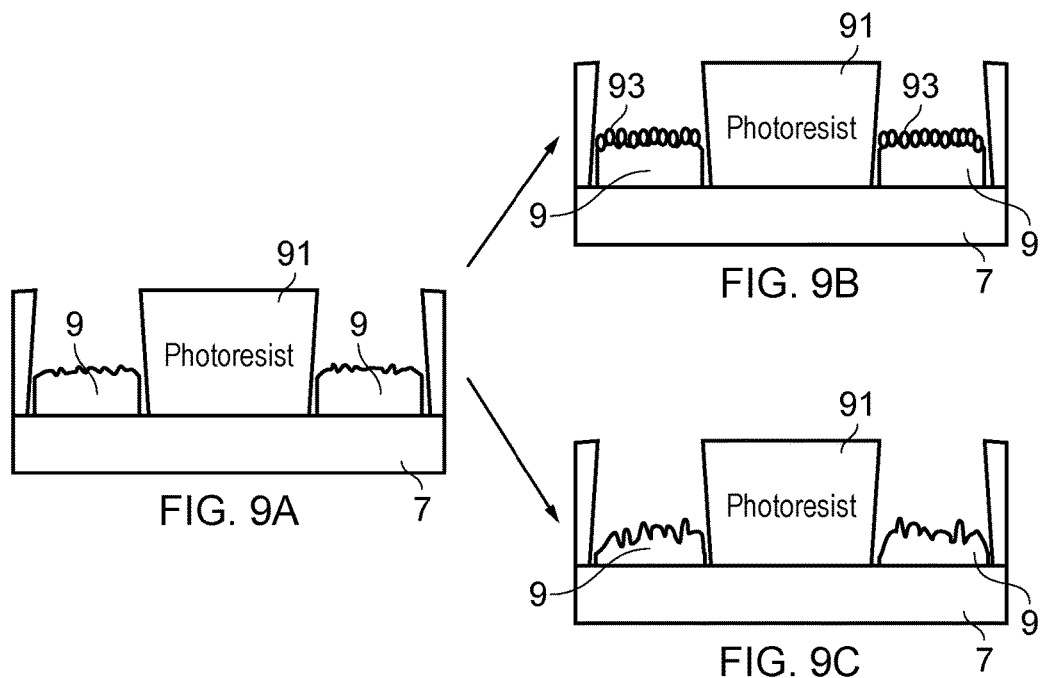
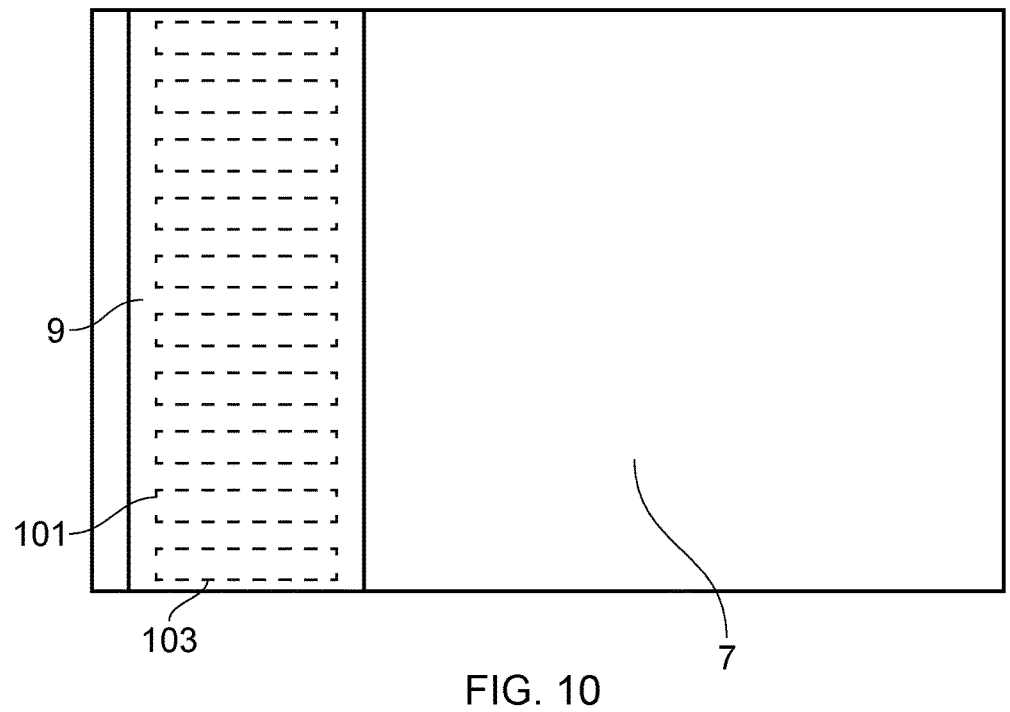

APPARATUS AND METHOD OF FORMING AN APPARATUS COMPRISING A TWO DIMENSIONAL MATERIAL

TECHNOLOGICAL FIELD

Examples of the disclosure relate to an apparatus and method of forming an apparatus comprising a two dimensional material. In particular, they relate to an apparatus and method of forming an apparatus comprising a two dimensional material wherein the two dimensional material is connected to one or more electrodes.

BACKGROUND

Apparatus comprising two dimensional materials such as graphene are known. Such apparatus may require electrodes to be coupled to the two dimensional material to provide sources and/or drains of charges for the two dimensional material.

It is useful to provide improved methods and apparatus for forming the apparatus and connecting the two dimensional material to the electrodes.

BRIEF SUMMARY

According to various, but not necessarily all, examples of the disclosure there may be provided a method comprising: forming first electrode portions on a substrate; providing a sheet of two dimensional material overlaying at least part of the first electrode portions; forming second electrode portions on a superstrate; positioning the superstrate overlaying the substrate so that the second electrode portions are aligned with the first electrode portions; and laminating the substrate and the superstrate together so that the sheet of two dimensional material is positioned between the aligned first electrode portions and the second electrode portions.

In some examples the two dimensional material may comprise graphene.

In some examples the two dimensional material may be functionalised with quantum dots.

In some examples the substrate and the superstrate may be laminated together so that the first electrode portions and the second electrode portions are galvanically connected.

In some examples the method may comprise forming electrical connections to the first electrode portions on the substrate.

In some examples the electrode portions may be configured to provide a source electrode and a drain electrode. The electrode portions may be configured to provide a plurality of source and drain electrodes. The two dimensional material may be provided as a continuous sheet between the plurality of source and drain electrodes.

In some examples the method may comprise forming a gate electrode within the substrate.

In some examples the electrode portions and the two dimensional material may form a field effect transistor.

In some examples the electrode portions may be arranged so that a first electrode is enclosed by a second electrode.

In some examples the method may comprise roughening at least one of the electrode portions to reduce contact resistance to the two dimensional material.

In some examples the superstrate may provide an encapsulation layer.

In some examples the superstrate may comprise a scintillator.

According to various, but not necessarily all, examples of the disclosure there may be provided an apparatus comprising: first electrode portions on a substrate; a sheet of two dimensional material overlaying at least part of the first electrode portions; second electrode portions on a superstrate; wherein the superstrate is positioned overlaying the substrate so that the second electrode portions are aligned with the first electrode portions; and the substrate and the superstrate are laminated together so that the sheet of two dimensional material is positioned between the aligned first electrode portions and the second electrode portions.

In some examples the two dimensional material may comprise graphene.

In some examples the two dimensional material may be functionalised with quantum dots.

In some examples the substrate and the superstrate may be laminated together so that the first electrode portions and the second electrode portions are galvanically connected.

In some examples the apparatus may comprise electrical connections to the first electrode portions on the substrate.

In some examples the electrode portions may be configured to provide a source electrode and a drain electrode. The electrode portions are configured to provide a plurality of source and drain electrodes. Two dimensional material may be provided as a continuous sheet between the plurality of source and drain electrodes.

In some examples the apparatus may comprise a gate electrode within the substrate.

In some examples the electrode portions and the two dimensional material may form a field effect transistor.

In some examples the electrode portions may be arranged so that a first electrode is enclosed by a second electrode.

In some examples at least one of the electrode portions may be roughened to reduce contact resistance to the two dimensional material.

In some examples the superstrate may provide an encapsulation layer.

In some examples the superstrate may comprise a scintillator.

According to various, but not necessarily all, examples of the disclosure there may be provided a sensing device comprising an apparatus as described above.

According to various, but not necessarily all, examples of the disclosure there is provided examples as claimed in the appended claims.

BRIEF DESCRIPTION

For a better understanding of various examples that are useful for understanding the detailed description, reference will now be made by way of example only to the accompanying drawings in which:

FIG. 1 illustrates an apparatus;
FIG. 2 illustrates a method;
FIG. 3 illustrates another apparatus;
FIGS. 4A to 4D illustrate another example apparatus;
FIG. 5 illustrates another example apparatus;
FIGS. 6A and 6B illustrate a substrate and a superstrate of another example apparatus;
FIGS. 7A and 7B illustrate example superstrates for use in an example apparatus;
FIGS. 8A to 8F illustrate example superstrates for use in an example apparatus;

FIGS. 9A to 9C illustrate electrode portions for use in an example apparatus;

FIG. 10 illustrates an example superstrate for use in an example apparatus;

DETAILED DESCRIPTION

Figure 1:
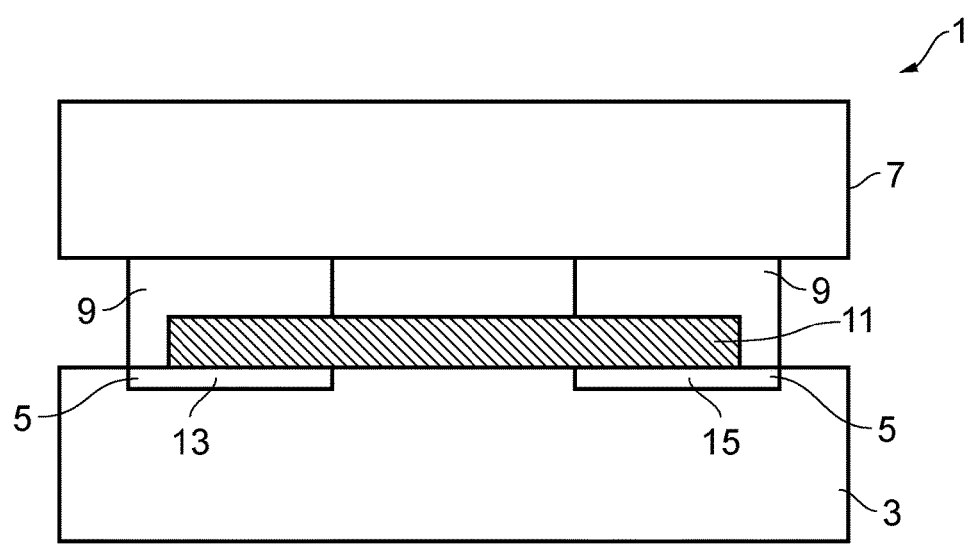

The figures illustrate example methods and apparatus. The example method comprises: forming 21 first electrode portions 5 on a substrate 3; providing a sheet of two dimensional material 11 overlaying at least part of the first electrode portions 5; forming second electrode portions 9 on a superstrate 7; positioning the superstrate 7 overlaying the substrate 3 so that the second electrode portions 9 are aligned with the first electrode portions 5; and laminating the substrate 3 and the superstrate 7 together so that the sheet of two dimensional material 11 is positioned between the aligned first electrode portions 5 and second electrode portions 9.

The method may be for forming apparatus 1 such as the apparatus 1 described below. The apparatus 1 may be used for sensing. For instance the apparatus 1 may be used for sensing physical parameters such as electromagnetic radiation, chemicals or any other suitable parameters. One or more apparatus 1 may be provided in a sensing device such as a photodetector.

FIG. 1 schematically illustrates a cross section through an apparatus 1 according to examples of the disclosure.

The apparatus 1 comprises a substrate 3 comprising first electrode portions 5 and a superstrate 7 comprising second electrode portions 9. The apparatus 1 also comprises a layer of two dimensional material 11.

The substrate 3 may provide a surface for supporting first electrode portions 5. The substrate 3 may also provide a surface for supporting the layer of two dimensional material 11.

The substrate 3 may comprise silicon or any other suitable material. The substrate 3 may comprise a flexible or a rigid material.

The first electrode portions 5 may be formed on the surface of the substrate 3. In some examples the first electrode portions 5 may be formed in situ on the surface of the substrate 3. The first electrode portions 5 could be formed using any suitable fabrication methods.

The first electrode portions 5 may be patterned onto the surface of the substrate 3 to form a particular pattern. In the example of FIG. 1 two first electrode portions 5 are provided. The two first electrode portions 5 are spaced apart on the surface of the substrate 3. The first electrode portions 5 may be patterned to form electrodes such as a source 13 and a drain 15. Routing from the electrode portions 5 may also be patterned onto the surface of the substrate 3.

The first electrode portions 5 may comprise a conductive material such as a metal or any other suitable material.

A layer of two dimensional material 11 is provided overlaying at least part of the first electrode portions 5. In the example apparatus of FIG. 1 the layer of two dimensional material 11 overlays at least a part of both of the first electrode portions 5 and extends across the surface of the substrate 3 between the first electrode portions 5.

The two dimensional material 11 overlays at least part of the first electrode portions 5. This may provide electrical contact between the first electrode portions 5 and the two dimensional material 11. The two dimensional material 11 may be directly connected to the first electrode portions 5 to enable charge transfer between the two first electrode portions 5 via the two dimensional material 11. The two dimensional material 11 may be galvanically connected to the first electrode portions.

In some examples the two dimensional material 11 may be provided as a single continuous sheet on the surface of the substrate 3. The single continuous sheet does not need to be patterned on the substrate 3. This may reduce the number of defects and impurities in the two dimensional material 11.

In some examples the two dimensional material 11 may be patterned. The patterning of the two dimensional material 11 may be configured to prevent cross talk between adjacent electrodes so as to enable a plurality of sensors to be formed on the substrate 3.

The two dimensional material 11 may comprise graphene or any other suitable material. In some examples a plurality of layers of two dimensional material 11 may be provided.

In some examples the two dimensional material may be functionalised with quantum dots. The quantum dots may enable the apparatus 1 to be arranged to detect a particular physical parameter. The material that is used for the quantum dots may depend on the parameter that is to be detected.

In the example apparatus 1 a superstrate 7 is positioned overlaying the substrate 3. The superstrate 7 may provide a cover layer for the apparatus 1.

The superstrate 7 may comprise any suitable material. The material which is used for the superstrate 7 may depend on the parameter that the apparatus 1 is arranged to detect.

In some examples the apparatus 1 may be arranged to detect electromagnetic radiation such as visible light. In such examples the superstrate 7 may comprise a material such as glass. The glass may be arranged to be transparent to visible light.

In some examples the superstrate 7 may comprise a coating layer. The second electrode portions 9 may be patterned onto the coating layer. In some examples the coating layer may comprise a flexible material which may enable the superstrate 7 to be pushed up against the substrate 3 when the substrate 3 and superstrate 7 are laminated together. The coating layer may comprise any suitable material such as polydimethylsiloxane (PDMS). In some examples the coating layer may prevent any air gaps between the superstrate 7 and the layer of two dimensional material 11. This may provide a better index matching for the electromagnetic radiation which may improve the efficiency of the apparatus 1.

In some examples the superstrate 7 may comprise a flexible material such as polyethylene naphthalate (PEN) or any other suitable flexible material. In such examples the superstrate 7 may comprise a thin film barrier layer. The thin film barrier layer may act to protect the two dimensional material 11. The second electrode portions 9 may be deposited on the thin film barrier layer. In some examples the thin film barrier layer may comprise a metal oxide such as SiOx or AlOx. The metal oxides could be deposited using any suitable fabrication methods such as atomic layer deposition (ALD) or any other suitable technique. In some examples the thin film barrier layer may comprise a plurality of layers. The plurality of layers may comprise alternate layers of metal oxides and vacuum-deposited organic mixture.

In some examples the superstrate 7 may provide an encapsulating layer for the apparatus 1. The encapsulating layer may be arranged to prevent fluid ingress or other chemicals from reaching the two dimensional material 11 and degrading the performance of the two dimensional material 11.

In some examples the superstrate 7 may comprise a scintillating material. The scintillating material may be configured to absorb electromagnetic radiation at a first wavelength and reemit it at a second wavelength. The scintillating material may be selected so as to optimize the efficiency of the apparatus 1. In some examples the scintillator may comprise caesium iodide or any other suitable material. In some examples the scintillator superstrate 7 may be provided as a stack comprising a scintillator and a fibre optic plate. In some examples the superstrate 7 may comprise a composite material comprising scintillator materials dispersed in a host matrix or any other suitable arrangement of scintillator material.

In some examples the superstrate 7 may comprise lenses or waveguides which may be configured to direct incident radiation on the layer of two dimensional material 11 or quantum dots provided overlaying the two dimensional material 11. In some examples the superstrate 7 may be configured to provide a microlens array. In such examples the apparatus 1 may comprise a plurality of pixels and the superstrate 7 may be arranged to provide a lens for each pixel.

In some examples the superstrate 7 may comprise a pyroelectric material such as polyvinylidene difluoride (PVDF). This may enable the apparatus 1 to be used a bolometer to detect heating of the apparatus 1 and/or infra red radiation.

In some examples the superstrate 7 may comprise a piezoelectric material such as lead zirconate titanate (PZT). This may enable the apparatus 1 to be used to detect deformation or changes in shape of the superstrate 7.

In some examples the apparatus 1 may be arranged to detect radio frequency electromagnetic radiation. In some examples the apparatus 1 may be arranged to operate as part of an antenna. The antenna may be arranged to receive and transmit radio frequency signals. The apparatus 1 may be configured to modulate the radio frequency signals. In such examples the superstrate 7 may comprise PTFE composite laminate or other suitable low-loss materials. In some examples the superstrate 7 may comprise a metal shielding layer. The metal shielding layer may be provided on the opposite side of the superstrate 7 to the second electrode portions 9. The metal shielding layer may be provided on portions of the superstrate 7 so as to confine radio frequency signals within the apparatus 1 in the portions where the metal shielding layer is provided.

The superstrate 7 may be provided as a thin layer. In some examples the superstrate 7 may be provided in a thin layer so that the superstrate 7 is flexible. This may enable a flexible apparatus 1 to be provided. In some examples the superstrate 7 may have a thickness from tens of microns to millimeters.

The superstrate 7 may provide a surface for supporting second electrode portions 9. The second electrode portions 9 may be formed on the surface of the superstrate 7. In some examples the second electrode portions 9 may be formed in situ on the surface of the superstrate 7. The second electrode portions 9 could be formed using any suitable fabrication methods.

The second electrode portions 9 may be patterned onto the surface of the superstrate 7 to form a pattern corresponding to the pattern of the first electrode portions 5. In the example of FIG. 1 two second electrode portions 9 are provided. The two second electrode portions 9 are spaced apart on the surface of the superstrate 7. The spacing between the two second electrode portions 9 may be the same as the spacing between the two first electrode portions 5. This may ensure that the second electrode portions 9 can be aligned with the first electrode portions 5.

The second electrode portions 9 are positioned on the superstrate 7 so that when the superstrate 7 and the substrate 3 are laminated together the second electrode portions 9 contact the first electrode portions 5. The second electrode portions 9 may touch the first electrode portions 5 so that the second electrode portions are galvanically connected to the first electrode portions 5. This may enable the first electrode portions 5 and the second electrode portions 9 to be coupled together to form single electrodes.

The second electrode portions 9 may be patterned to form part of electrodes. In the example of FIG. 1 the second electrode portions 9 form part of a source 13 and a drain 15. In the example apparatus of FIG. 1 no routing is provided on the superstrate 7 as the second electrode portions 9 are galvanically connected to the first electrode portions 5. In some examples the second electrode portions 9 may indent the first electrode portions 5 to ensure that the first electrode portions 5 and the second electrode portions 9 connect to each other and/or to increase the contact area between the first electrode portions 5 and the second electrode portions 9.

The second electrode portions 9 may comprise a conductive material such as a metal or any other suitable material. In some examples the second electrode portions may comprise the same material as the first electrode portions 5.

In some examples the second electrode portions 9 may comprise eutectic metals or solders. In such examples contact between the two dimensional material 11 and the second electrode portions may be formed by gentle reflow after the substrate 3 and the superstrate 7 are laminated together. In some examples the eutectic metals could comprise InSn alloys. The eutectic InSn alloys have a melting point of around 110-150° C. which is the lowest of lead free solders. InSn alloys are also malleable and non toxic. In other examples the metals could comprise BiSn which has a melting point of 138° C. or other fusible alloys with a low melting point such as Wood's metal, Field's metal, Rose's metal or any other suitable metal.

In some examples the second electrode portions 9 may comprises GaIn eutectics such as Galinstan. Such materials are liquid at room temperature and may be useful in apparatus 1 which contain cavities and other structures.

In the example apparatus 1 of FIG. 1 the substrate 3 and the superstrate 7 are laminated together. The substrate 3 and the superstrate 7 are laminated together so that the sheet of two dimensional material 11 is positioned between the aligned first electrode portions 5 and second electrode portions 9. The two dimensional material 11 may be positioned between the first electrode portions 5 and the second electrode portions 9 so that the two dimensional material 11 is electrically connected to both the first electrode portions 5 and the second electrode portions 9. This may increase the surface area of the electrodes in contact with the two dimensional material 11 which may improve the contact resistance between the electrodes and the two dimensional material 11.

In some examples the first electrode portions 5 and the second electrode portions 9 may be bonded together to ensure that there is a good connection between the first electrode portions 5 and the second electrode portions 9. In some examples ultrasonic bonding may be used. The ultrasonic bonding may ensure that heat is only generated at the point of contact between the first electrode portions 5 and the second electrode portions 9. This may prevent any thermally sensitive parts of the apparatus 1 from being damaged. In some examples eutectic bonding processes may be used. For examples Au-hi bonding may occur at 156° C. This temperature may be low enough to prevent damage of other parts of the apparatus 1.

Figure 2:
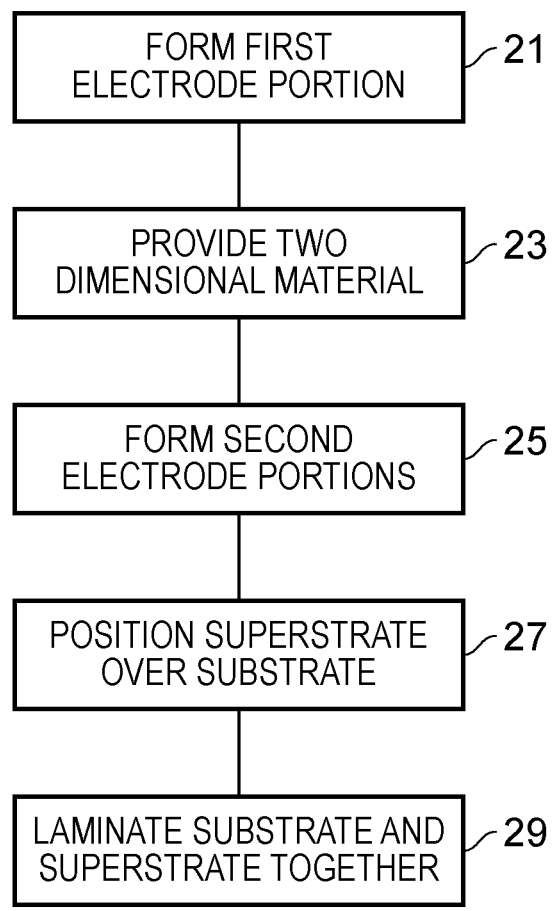

FIG. 2 illustrates a method. The method may be used to form apparatus 1 according to examples of the disclosure.

The method comprises, at block 21 forming first electrode portions 5 on a substrate 3 and, at block 23 providing a sheet of two dimensional material 11 overlaying at least part of the first electrode portions 5. The method also comprises, at block 25, forming second electrode portions 9 on a superstrate 7. At block 27 the method comprises positioning the superstrate 7 overlaying the substrate 3 so that the second electrode portions 9 are aligned with the first electrode portions 5 and at block 29 the method comprises laminating the substrate 3 and the superstrate 7 together so that the sheet of two dimensional material 11 is positioned between the aligned first electrode portions 5 and the second electrode portions 9.

It is to be appreciated that the blocks of the method may be carried out in any suitable order. For instance, the first electrode portions 5 and the second electrode portions 9 may be formed in any order. hi some examples the second electrode portions 9 could be formed before the first electrode portions 5 or the electrode portions 5, 9 could be formed at the same time.

Figure 3:
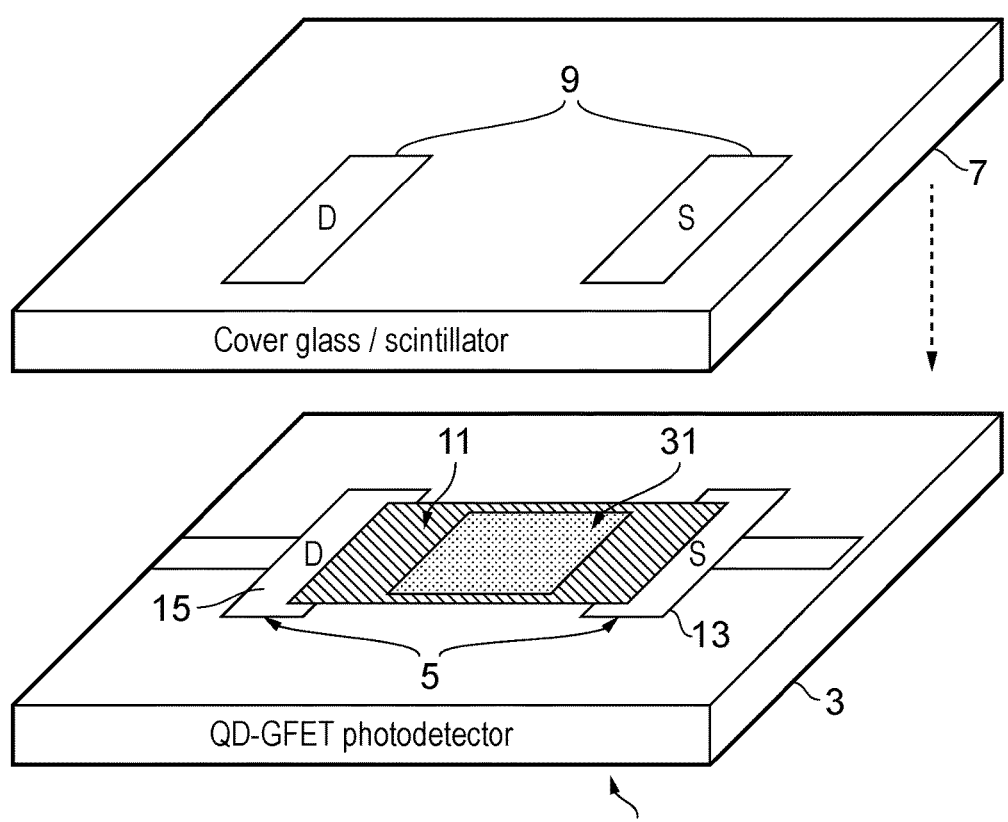

FIG. 3 illustrates an exploded view of an apparatus 1 according to examples of the disclosure. The example apparatus 1 of FIG. 1 comprises a substrate, 3 a superstrate 7, first electrode portions 5, second electrode portions 9 and a sheet of two dimensional material 11 as described above. Corresponding reference numbers are used for corresponding features. In the example of FIG. 3 the apparatus 1 is arranged to provide a photodetector. It is to be appreciated that the apparatus 1 may be arranged to detect other parameters in other examples of the disclosure.

In the example apparatus 1 of FIG. 3 the first electrode portions 5 provide source 13 and drain 15 electrodes. Routing to the source 13 and drain 15 electrodes is provided on the surface of the substrate 3. In the example of FIG. 3 both the source 13 and the drain 15 electrodes are rectangular. Other shaped electrode portions may be used in other examples of the disclosure.

In FIG. 3 the sheet of two dimensional material 11 is positioned overlaying part of the first electrode portions 5. A part of the first electrode portions 5 is left uncovered to enable the first electrode portions 5 to be connected to the second electrode portions 9. In the example of FIG. 3 a part of each of the first electrode portions is left uncovered.

In the example of FIG. 3 the two dimensional material comprises graphene 11. The graphene is functionalized with quantum dots 31. The quantum dots 31 that are used in the apparatus 1 may depend on the parameter that is to be detected by the apparatus 1.

In the example of FIG. 3 the second electrode portions 9 are arranged on the underside of the superstrate 7. In the example of FIG. 3 the second electrode portions 9 are the same size and shape as the first electrode portions 5. This may ensure that there is good overlap between the first electrode portions 5 and the second electrode portions 9. This may ensure that the second electrode portions 9 are connected to both the first electrode portions 5 and the two dimensional material 11.

The superstrate 7 may comprise any suitable material. The material that is used for the superstrate 7 may depend on the application that the apparatus 1 is used for. The material that is used for the superstrate 7 may depend on the parameter or parameters that the apparatus 1 is arranged to detect.

In some examples the apparatus 1 may be arranged as a photodetector. In such examples the superstrate 7 may comprise an optically transparent material. In some examples the apparatus 1 may be arranged to detect radiation outside of the visible spectrum. In such cases the superstrate 7 may comprise a material which is opaque to light within the visible spectrum but is transparent to a range of frequencies outside of the visible spectrum.

In the example of FIG. 3 the superstrate 7 comprises glass. The glass may act to encapsulate the two dimensional material 11 and the electrode portions 5, 9. In the example of FIG. 3 the superstrate 7 also comprises a scintillator.

In the example of FIG. 3 the first electrode portions 5 are arranged on the surface of the substrate 5 to provide a source 13 and drain 15 of a field effect transistor. In some examples a gate electrode may be provided within the substrate 3. The field effect transistor may enable the apparatus 1 to be used to sense one or more parameters.

FIGS. 4A to 4D illustrate another example apparatus 1 according to examples of the disclosure.

Figure 4A:
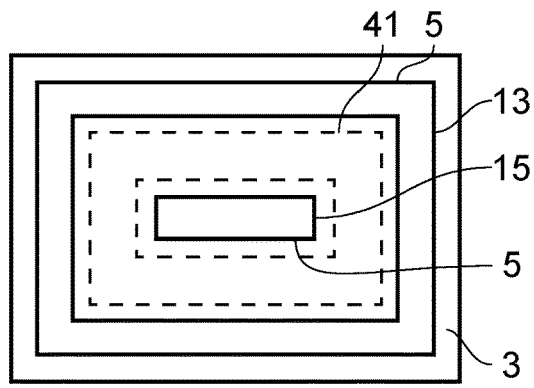

FIG. 4A illustrates a plan view of a surface of a substrate 3. The substrate 3 comprises first electrode portions 5 arranged to form a source 13 and a drain 15. The view shown in FIG. 4A may comprise a portion of a surface of the substrate 3. The substrate 3 may comprise a plurality of first electrode portions 5 which may be arranged in the same way as the example of FIG. 4A.

In the example of FIGS. 4A to 4D the drain electrode 15 is provided as a rectangular portion in the centre of the illustrated portion of the substrate 3. The source electrode 13 is provided around the edge of the portion of the substrate 3 illustrated in FIG. 4A. The source electrode 13 encloses the drain electrode 15. hi the example of FIG. 4A the source electrode 13 fully encloses the drain electrode 15. In other examples the source electrode 13 might partially enclose the drain electrode 15.

The substrate 3 also comprises a gate electrode 41. In the example of FIGS. 4A to 4D the gate electrode 41 is provided embedded within the substrate 3. The gate electrode 41 is indicated by dashed lines in FIG. 4A as it would not be visible on the surface of the substrate 3. The gate electrode 41 is provided between the source electrode 13 and the drain electrode 15. The gate electrode 41 also encloses or at least partially encloses the drain electrode 15.

In the example of FIG. 4A the source electrode 13 encloses the drain electrode 15. It is to be appreciated that in other examples the drain electrode 15 could be provided enclosing the source electrode 13.

The layer of two dimensional material 11 is not shown in FIG. 4A. The layer of two dimensional material 11 may be provided as a continuous sheet of material. The layer of two dimensional material 11 may completely cover the first electrode portions 5.

This example electrode layout may enable a plurality of field effect transistors to be provided on the substrate 3 and share the same continuous layer of two dimensional material 11. The electrode layout reduces cross talk between adjacent transistors and so enables the adjacent transistors to be formed from one continuous sheet of two dimensional material 11.

Figure 4B:
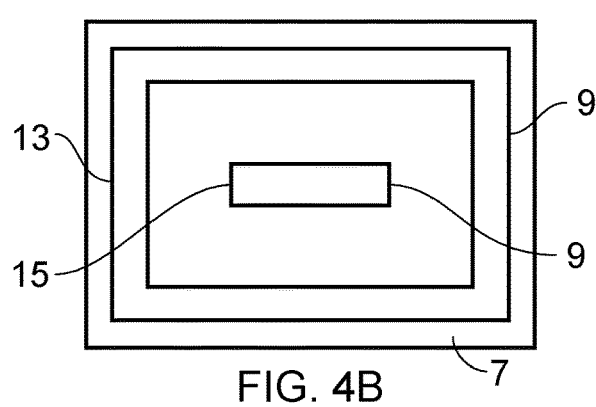

FIG. 4B illustrates a plan view of a surface of a superstrate 7. The superstrate 7 comprises second electrode portions 9 arranged to form a source 13 and a drain 15. The view shown in FIG. 4B may comprise a portion of a surface of the superstrate 7. The superstrate 7 may comprise a plurality of second electrode portions 9 which may be arranged in the same way as the example of FIG. 4B.

In the example of FIG. 4B the second electrode portions 9 are provided in a layout which matches the layout of the first electrode portions 5. This enables the second electrode portions 9 to be positioned in alignment with the first electrode portions 5 when the substrate 3 and the superstrate 7 are laminated together.

Figure 4C:
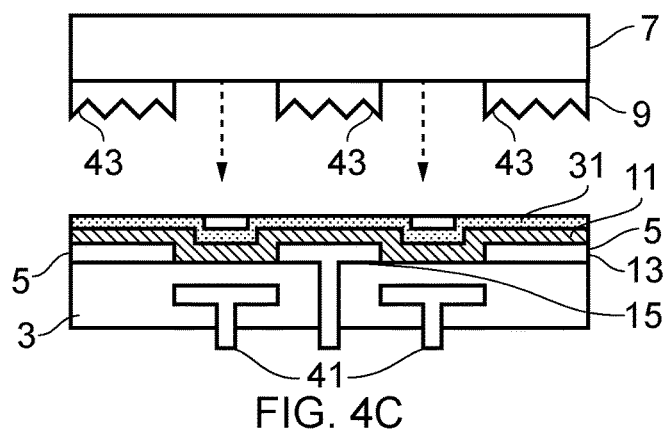

FIG. 4C illustrates a cross section through the substrate 3 and the superstrate 7 before they are laminated together.

In the example of FIG. 4C the embedded gate electrode 41 can be seen. The layer of two dimensional material 11 is provided on the substrate 3. In the example of FIG. 4C the two dimensional material 11 covers the first electrodes portions 5 which are provided on the surface of the substrate 3. In the example of FIG. 4C a layer of quantum dots 31 is provided overlaying the layer of two dimensional material 11.

The superstrate 7 is positioned above the substrate 3 so that the second electrode portions 9 are aligned with the first electrode portions.

In the example of FIG. 4C the first electrode portions 5 may be smooth. This may provide a smooth surface for the two dimensional material 11 to be deposited upon. This may reduce any defects within the two dimensional material 11.

In the example of FIG. 4C the second electrode portions 9 are roughened. This provides an uneven surface for the second electrode portions 9. The uneven surface may comprise a plurality of indents 43. The uneven surface may enable the second electrode portions to at least partially puncture through the layer of two dimensional material 11 and provide a connection to the first electrode portions 5.

Figure 4D:
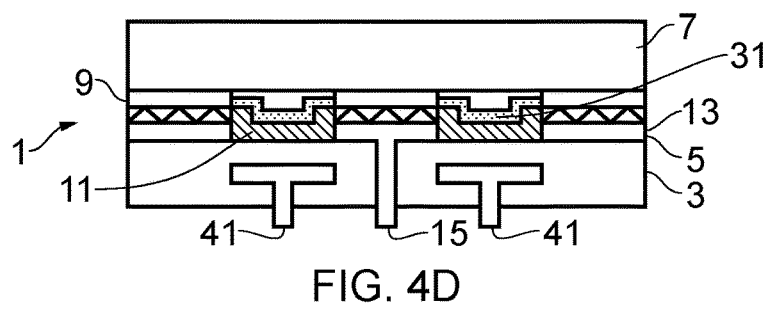

FIG. 4D illustrates a cross section through the apparatus 1 after the substrate 3 and the superstrate 7 are laminated together. When the substrate 3 and the superstrate 7 are laminated together the continuous sheet of two dimensional material 11 is positioned between the aligned first electrode portions 5 and the second electrode portions 9.

In the example of FIG. 4D the roughened second electrode portions 9 have punctured through the layer of two dimensional material 11 to connect to the first electrode portions 5. This enables the source electrode 13 and the drain electrode 15 to be formed from both the first electrode portions 5 and the second electrode portions 9.

As the roughened second electrode portions 9 have punctured through at least part of the layer of two dimensional material 11 this may have introduced some localized defects in the two dimensional material 11. The defects may be localized to the areas of the two dimensional material 11 which are positioned between the first electrode portions 5 and the second electrode portions 9. The localized defects may improve the contact resistance between the electrodes 5, 9 and the two dimensional material 11.

In some examples the indents 43 on the second electrode portions 9 may create indents on the first electrode portions 5 when the substrate 3 and the superstrate 7 are laminated together. This may improve the contact between the first electrode portions 5 and the second electrode portions 9.

In the examples of 4A to 4D the two dimensional material is provided as a single continuous sheet. As the two dimensional material 11 is provided as a single continuous sheet this reduces the defects that may be added to the material during patterning or other fabrication techniques. This ensures that the two dimensional material 11 has a high level of charge mobility and makes the apparatus 1 more efficient. As the two dimensional material 11 is connected to both the first electrode portions 5 and the second electrode portions 9 this decreases the contact resistance between the electrodes and the layer of two dimensional material 11. This improves the sensitivity of the apparatus 1.

Figure 5:
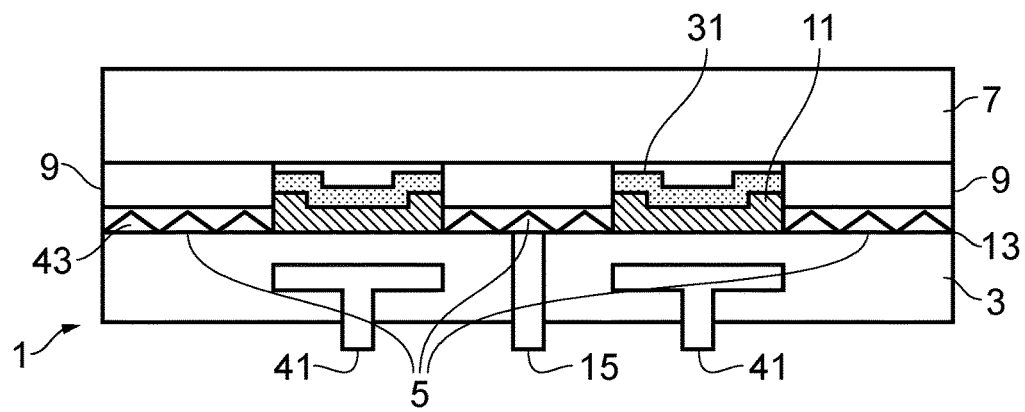

FIG. 5 illustrates another example apparatus 1. The example apparatus is similar to the apparatus 1 as illustrated in FIGS. 4A to 4D and described above. Corresponding reference numerals are used for corresponding features.

In the example of FIG. 5 the first electrode portions are roughened so that that the surface of the first electrode portions comprise a plurality of indents 43. This may enable the first electrode portions 5 to puncture through the layer of two dimensional material 11 to contact the second electrode portions 9.

In the example of FIG. 5 the second electrode portions 9 may also be roughened or the second electrode portions 9 may be smooth. The indents 43 of the first electrode portions 5 may create corresponding indents on the second electrode portions 9. hi some examples indents on a second electrode portion 9 may create corresponding indents on first electrode portions 5.

Figure 6A:
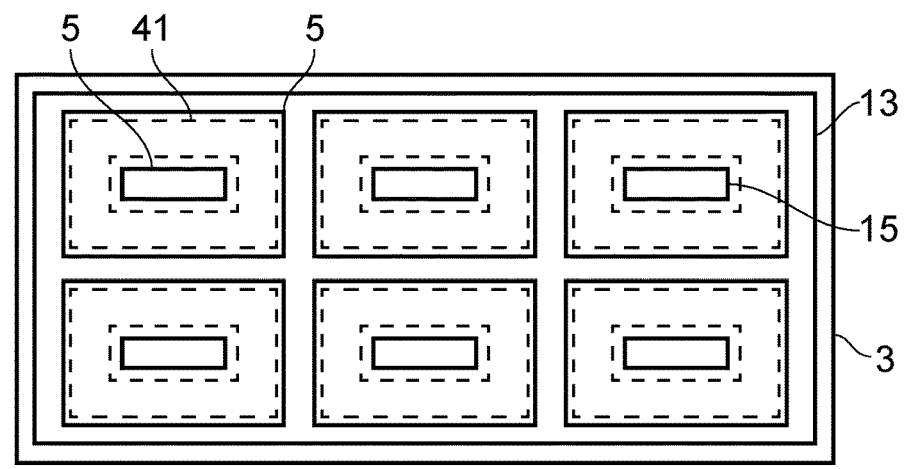
Figure 6B:
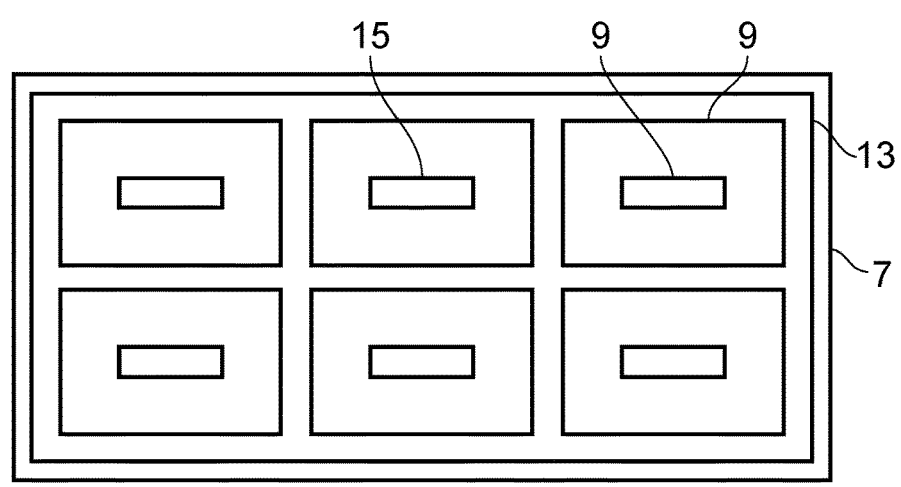

FIG. 6A illustrates a substrate 3 and FIG. 6B illustrates a superstrate 7 of another example apparatus 1.

FIG. 6A illustrates a plan view of a surface of a substrate 3. The substrate 3 comprises a plurality of first electrode portions 5 arranged to form a plurality of sources 13 and a plurality of drains 15. Each of the sources 13 and drains 15 may be arranged as illustrated in the example of FIG. 4A with the source electrode 13 fully enclosing the drain electrode 15.

As in the example of FIG. 4A a plurality of gate electrodes 41 are provided embedded within the substrate 3 as indicated by dashed lines. The gate electrodes 41 are provided between the source electrodes 13 and the drain electrodes 15 and enclose or at least partially enclose the drain electrode 15.

The layer of two dimensional material 11 is not shown in FIG. 6A. The layer of two dimensional material 11 may be provided as a continuous sheet of material overlaying the plurality of first electrode positions 5.

FIG. 6B illustrates a plan view of a surface of a corresponding superstrate 7. The superstrate 7 comprises a plurality of second electrode portions 9 arranged to form a plurality of sources 13 and a plurality of drains 15. In the example of FIG. 6B the plurality of second electrode portions 9 are provided in a layout which matches the layout of the plurality of first electrode portions 5. This enables the plurality of second electrode portions 9 to be positioned in alignment with the plurality first electrode portions 5 when the substrate 3 and the superstrate 7 are laminated together.

This example electrode layout may enable a plurality of field effect transistors to be within an apparatus 1 and share the same continuous layer of two dimensional material 11. The electrode layout reduces cross talk between adjacent transistors and so enables the same sheet of two dimensional material 11 to be used for adjacent transistors. This enables a continuous sheet of two dimensional material 11 to be used without requiring any patterning of the two dimensional material 11. This reduces the defects within the two dimensional material 11 and may increase the efficiency of the apparatus 1.

In the example of FIGS. 6A and 6B six transistors would be provided within the apparatus 1. It is to be appreciated that other numbers of transistors would be provided in other examples of the disclosure.

Figure 7A:
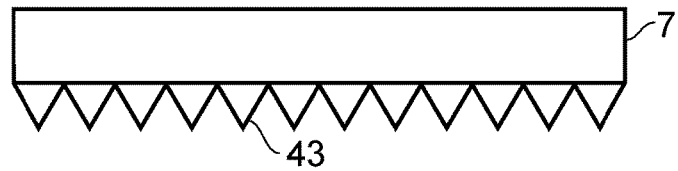
Figure 7B:
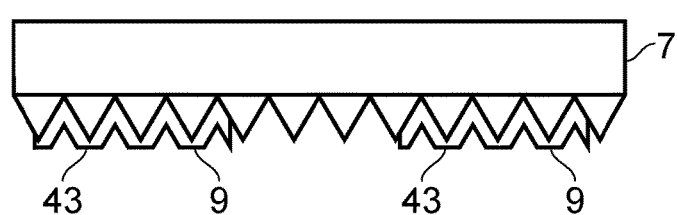

FIGS. 7A and 7B illustrate example superstrates 7 for use in apparatus 1 according to examples of the disclosure. The example superstrates 7 may be used to provide roughened second electrode portions 9. The superstrate 7 may comprise glass or a scintillator and fibre optic plate or any other materials which may be as described above.

In FIG. 7A the surface of the superstrate 7 is pre-textured. The pre-texturing may leave a plurality of indents 43 on the surface of the superstrate 7.

The surface of the superstrate 7 may be pre-textured using any suitable techniques. For instance if the superstrate 7 comprises a material such as glass the surface may be pre-textured by using an etchant such as hydrogen fluoride. If the superstrate 7 comprises a material such as silicon the surface may be pre-textured by dry-etching or reactive ion etching. If the superstrate 7 comprises a material such as a polymer the surface may be pre-textured by imprinting or moulding or any other suitable technique.

In FIG. 7B the second electrode portions 9 are deposited onto the surface of the superstrate 7. The second electrode portions 9 may be formed by metallization or any other suitable techniques. As the second electrode portions 9 are formed on an indented surface the second electrode portions 9 also comprise a plurality of indents 43. The indents in the second electrode portion 9 may be sufficient to enable the second electrode portion to puncture through the layer of two dimensional material 11 when the superstrate 7 is laminated with a substrate 3.

In the example of FIG. 7A and the 7B the whole of the surface of the superstrate 7 is pre-textured. In other examples only the portions of the superstrate 7 where the second electrode portions 9 are to be deposited might be pre-textured.

FIGS. 8A to 8F illustrate example superstrates 7 for use in an example apparatus. The superstrates 7 in FIGS. 8A to 8F enable elevated second electrode portions 9 to be provided.

Figure 8A:
Figure 8D:
Figure 8B:
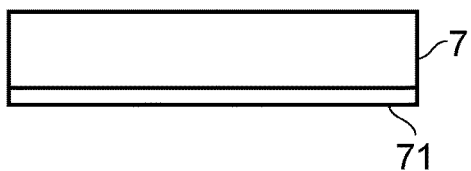
Figure 8E:
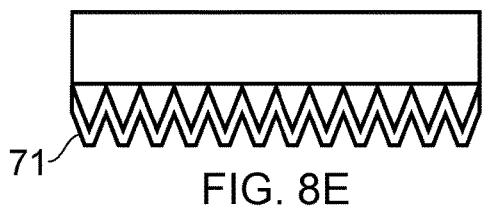
Figure 8C:
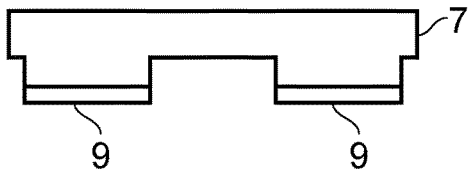

In the examples of FIGS. 8A to 8C smooth second electrode portions 9 are provided. In FIG. 8A a superstrate 7 is provided. The superstrate 7 has a smooth surface. The superstrate 7 may comprise any suitable materials which may be as described above.

In FIG. 8B the surface of the superstrate 7 is metalized. A layer 71 of metal is provided on the surface of the superstrate 7. In the example of FIG. 8B the layer 71 of metal is provided over the entire surface of the superstrate 7.

In FIG. 8C the superstrate 7 and the layer 71 of metal are patterned to form the second electrode portions 9. Any suitable technique may be used to pattern the superstrate 7 and the layer 71 of metal. In the example of FIG. 8C the superstrate 7 is patterned so that the superstrate 7 is recessed outside of the regions where the second electrode portions 5 are provided. This enables elevated second electrode portions 9 to be provided.

Figure 8F:
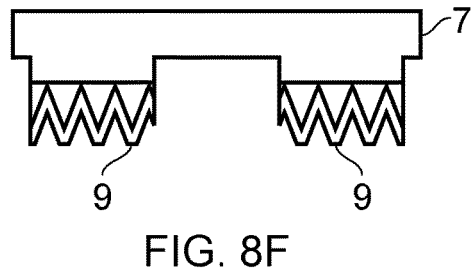

In the examples of FIGS. 8D to 8F roughened second electrode portions 9 are provided. In FIG. 8D a superstrate 7 is provided. The superstrate 7 may comprise any suitable materials which may be as described above. The superstrate 7 has a rough surface comprising a plurality of indents 43. The surface of the superstrate 7 may be pre-textured as described above.

In FIG. 8E the surface of the superstrate 7 is metalized. A layer 71 of metal is provided on the pre-textured surface of the superstrate 7. In the example of FIG. 8E the layer 71 of metal is provided over the entire surface of the superstrate 7. As the surface of the superstrate 7 is pre-textured the layer 71 of metal which is formed is also textured. The layer 71 of metal also comprises a plurality of indents 43.

In FIG. 8F the superstrate 7 and the layer 71 of metal are patterned to form the second electrode portions 9. Any suitable technique may be used to pattern the superstrate 7 and the layer 71 of metal. In the example of FIG. 8F the superstrate 7 is patterned so that the superstrate 7 is recessed outside of the regions where the second electrode portions 9 are provided so as to enable elevated second electrode portions 9 to be provided.

FIGS. 9A to 9C illustrates examples of forming roughened second electrode portions 9 for use in example apparatus 1. It is to be appreciated that similar techniques could be used to provide roughened first electrode portions 5.

In FIG. 9A the second electrode portions 9 are formed on the surface of the superstrate 7. The surface of the superstrate 7 may be smooth or pre-textured.

The second electrode portions 9 may be patterned using a layer of photo-resist 91 or any suitable method.

The second electrode portions 9 may be deposited using any suitable techniques such as sputtering or thermal evaporation. This may leave the second electrode portions with nanoscale roughness. This scale of roughness may be insufficient to enable the second electrode portions 9 to puncture through the layer of two dimensional material 11 and contact the first electrode portions 5.

FIGS. 9B and 9C illustrate example methods of increasing the roughness of the second electrode portions 9.

In the example of FIG. 9B a layer of metal nanostructures 93 may be added to the surface of the second electrode portions 9. The metal nanostructures 93 may be templated from block copolymer templates.

The metal nanostructures may have any suitable shapes. In some examples the metal nanostructure 93 may be gyroidal or cylindrical or any other shape or combination of shapes. In some examples the metal nanostructures 93 may have random shapes.

In the example of FIG. 9C the surface of the second electrode portions 9 is etched to increase the roughness. Any suitable etching techniques could be used such as dry reactive ion etching or wet chemical etching or any other suitable technique.

It is to be appreciated that other examples of increasing the roughness of the second electrode portions 9 may be used in other examples of the disclosure. For instance electroless deposition or any other suitable technique could be used.

In the examples of FIGS. 9B and 9C the roughness of the second electrode portions 9 has been increased to a macroscopic scale. This scale of roughness may be sufficient to enable the second electrode portions 9 to puncture through the layer of two dimensional material and contact the first electrode portions 5.

FIG. 10 illustrates an example superstrate 7 which may be used in an example apparatus 1. The superstrate 7 could be an encapsulating layer or a scintillator or any other type of superstrate 7.

The superstrate 7 comprises a second electrode portion 9. In the example of FIG. 10 one second electrode portion 9 is provided at the left hand side of the superstrate 7. It is to be appreciated that other numbers and arrangements of second electrode portions 9 may be provided in other examples of the disclosure.

In the example of FIG. 10 the second electrode portion 9 comprises a plurality of roughened portions 101. The roughened portions have edges 103 indicated by the dashed lines in FIG. 10.

The plurality of roughened portions 101 are distributed across the surface of the second electrode portion 9. In the example of FIG. 10 the roughened areas 101 extend almost all of the way across the width of the second electrode portions 9. This may increase the total length of the edges 103 of the roughened areas 101.

The roughened areas 101 may be formed using any suitable technique such as etching or metal nanostructures.

The roughened areas 101 may be roughened on a macroscopic scale such that when the substrate 3 and the superstrate 7 are laminated together the roughened areas 101 completely break up the layer of two dimensional material underneath the roughened areas 101. This may ensure that there is a good galvanic connection between the first electrode portions 5 and the second electrode portions 9.

In the example of FIG. 10 the edges 103 of the roughened areas 101 enable injection of charges into or extraction of charges from the two dimensional material 11. In such examples the shapes and sizes of the roughened areas 101 may be selected to optimize the overall length of the edges 103 for the charge injection or extraction.

Figure 11:
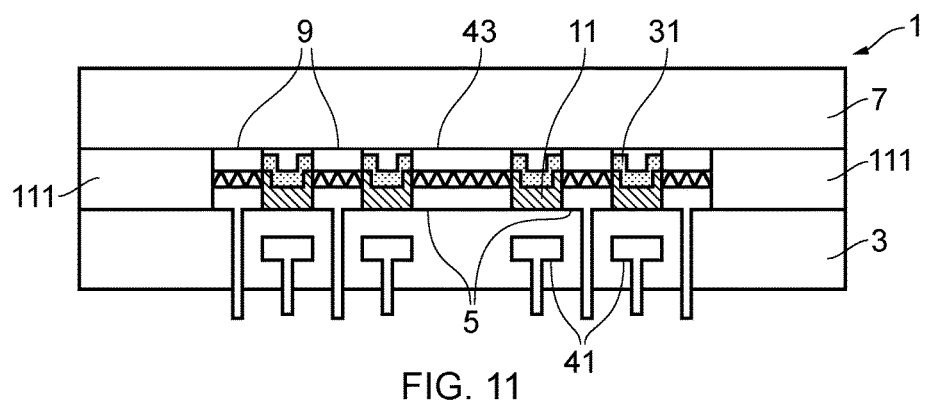
FIG. 11 illustrates an example apparatus.

FIG. 11 illustrates another apparatus 1 according to examples of the disclosure. The apparatus 1 comprises a substrate 3 comprising a plurality of first electrode portions 5 and a superstrate 7 comprising a plurality of second electrode portions 9. The layer of two dimensional material 11 is provided between the first electrode portions and the second electrode portions 9. In the example of FIG. 11 the layer of two dimensional material comprises a layer of quantum dots 31.

The electrode portions 5, 9 may be arranged in any suitable geometry. The electrode portions 5, 9 may be arranged to provide a plurality of field effect transistors. In the example of FIG. 11 a plurality of gate electrodes 41 are provided within the substrate 3.

In the example of FIG. 11 the second electrode portions 9 are roughened so that the surface of the second electrode portions 9 comprise a plurality of indents 43. The roughened second electrode portions 9 puncture through the layer of two dimensional material to contact the first electrode portions 5.

In the example of FIG. 11 the superstrate 7 provides an encapsulating layer for the apparatus 1. The encapsulating layer may act as a barrier to prevent contaminants from reaching the field effect transistors within the apparatus 1.

A layer of adhesive 111 is provided to laminate the substrate 3 to the superstrate 7. In FIG. 11 the adhesive 111 is only provided at the edges of the substrate 3 and the superstrate 7. This may prevent the adhesive 111 from interacting with the field effect transistors or other parts of the apparatus 1. The adhesive 111 may enclose the edges of the apparatus 1 to provide encapsulation of the apparatus 1.

In other examples the adhesive 111 may be provided in areas other than the edge of the substrate 3 and superstrate 7. For instance, in some examples the adhesive 111 may be provided in all areas other than on the electrode portions 5, 9. In such examples the adhesive 111 may be arranged so that the adhesive enables the parameter that is to be sensed to be detected by the two dimensional material 11. For example, where the apparatus 1 is to be used as a photodetector the adhesive 111 may comprise an optically clear adhesive 111. The adhesive 111 may be selected to provide optical matching between optically sensitive components of the apparatus 1.

Figure 12:
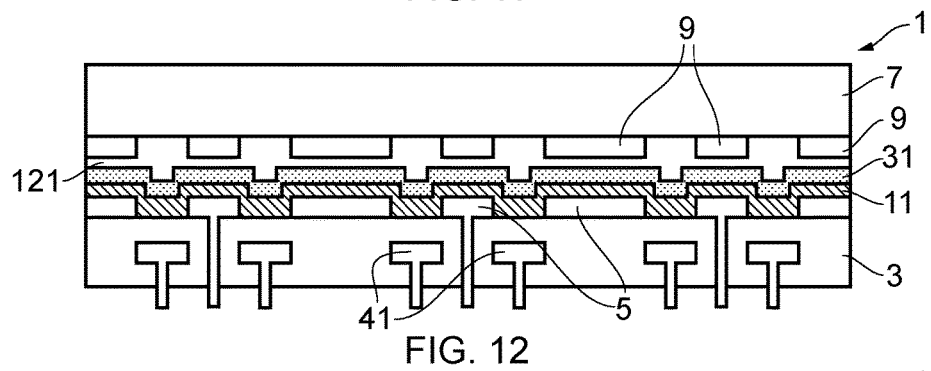
FIG. 12 illustrates an example apparatus.

FIG. 12 illustrates another example apparatus 1 according to examples of the disclosure. The apparatus 1 comprises a substrate 3 comprising a plurality of first electrode portions 5 and a superstrate 7 comprising a plurality of second electrode portions 9. The layer of two dimensional material 11 is provided between the first electrode portions 5 and the second electrode portions 9. In the example of FIG. 11 the layer of two dimensional material comprises a layer of quantum dots 31.

The electrode portions 5, 9 may be arranged in any suitable geometry. The electrode portions 5, 9 may be arranged to provide a plurality of field effect transistors. In the example of FIG. 12 a plurality of gate electrodes 41 are provided within the substrate 3.

In the example of FIG. 12 both the first electrode portions 5 and the second electrode portions 9 are smooth. As the first electrode portions 5 and the second electrode portions 9 do not directly contact each other there is no need for either of the electrode portions 5, 9 to be roughened to puncture through the layer of two dimensional material 11 or to indent the other electrode portions 5, 9.

A layer of adhesive 121 is provided across the apparatus 1. In the example of FIG. 12 the adhesive 121 is provided overlaying the quantum dots 31 and the two dimensional material 11. The adhesive 121 is provided between the layer of two dimensional material 11 and the superstrate 7.

The adhesive 121 may comprise an anisotropic conductive adhesive (ACA) or an anisotropic conductive film (ACF). The adhesive 121 may be arranged so that when the substrate 3 and superstrate 7 are laminated together the adhesive 121 will conduct in the vertical direction between the first electrode portions 5 and the second electrode portions 9 but will not conduct in the horizontal direction between adjacent second electrode portions 9. This enables the first electrode portions 5 and the second electrode portions 9 to be electrically connected without physically contacting each other.

As the adhesive 121 is provided overlaying the two dimensional material 11 the adhesive 121 may be selected so as not to affect the performance of the field effect transistor. For instance where the apparatus 1 is arranged as a photodetector the adhesive 121 may be optically transparent.

Figure 13A:
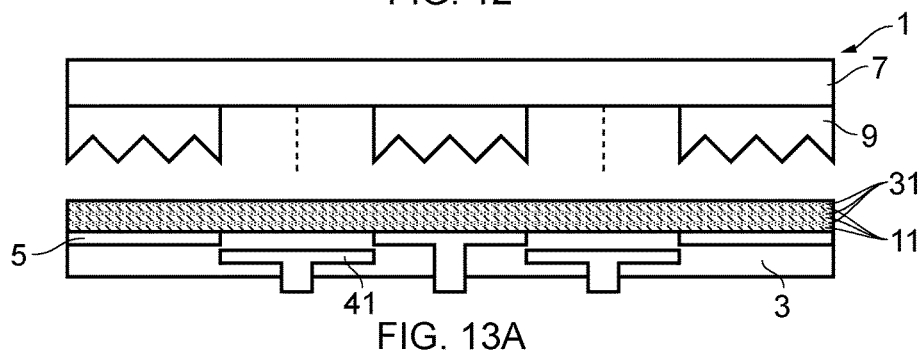
FIGS. 13A and 13B illustrate an example apparatus.
Figure 13B:
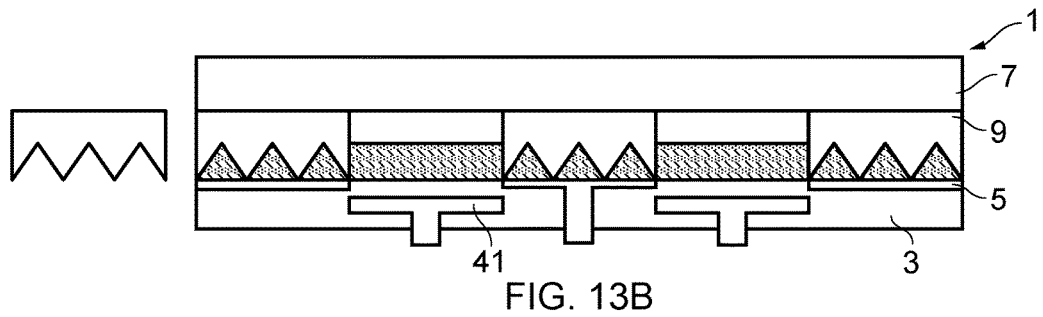

FIGS. 13A and 13B illustrate another example apparatus 1 according to examples of the disclosure. The example apparatus 1 comprises a substrate 3 comprising a plurality of first electrode portions 5 and a superstrate 7 comprising a plurality of second electrode portions 9 which may be as described above. FIG. 13A illustrates an exploded view of the apparatus 1 in which the first electrode portions 5 and the second electrode portions 9 are aligned and FIG. 13B illustrates the substrate 3 and the superstrate 7 laminated together.

In the examples of FIGS. 13A and 13B a plurality of layers of two dimensional material 11 are provided. In the FIGS. 13A and 13B a plurality of alternate layers of two dimensional materials 11 and quantum dots 31 are provided. Providing a plurality of layers of two dimensional material 11 and quantum dots 31 may increase the sensitivity of the apparatus 1.

In the examples of FIGS. 13A and 13B the second electrode portions 9 may be roughened so that they can puncture through the plurality of layers of two dimensional materials 11 and quantum dots 31 and contact the first electrode portions 5. The puncturing of the plurality of layers of two dimensional materials 11 and quantum dots 31 may only occur in the regions positioned between the first electrode portions 5 and the second electrode portions 9 so that the plurality of layers of two dimensional materials 11 and quantum dots 31 remain as individual layers at the other areas of the apparatus 1.

Examples of the disclosure provide for improved methods of manufacturing apparatus 1 comprising two dimensional materials. The examples of the disclosure allow a continuous sheet of two dimensional material to be used to make one or more sensing apparatus 1 on a substrate 3. This removes the need for any patterning or lithography which may improve the efficiency of such apparatus 1.

As the two dimensional material is sandwiched between two different electrode portions 5, 9 this may enable improved contact resistance which may also improve the efficiency of the apparatus 1.

The example methods also enable the device to be formed from a plurality of layers of two dimensional material. This may enable more sensitive devices to be formed.

As the superstrate 7 may act as an encapsulating layer this may enable the apparatus 1 to be encapsulated very quickly after it has been fabricated. This may improve the quality and performance of the apparatus 1.

The term "comprise" is used in this document with an inclusive not an exclusive meaning. That is any reference to X comprising Y indicates that X may comprise only one Y or may comprise more than one Y. If it is intended to use "comprise" with an exclusive meaning then it will be made clear in the context by referring to "comprising only one . . . " or by using "consisting".

In this detailed description, reference has been made to various examples. The description of features or functions in relation to an example indicates that those features or functions are present in that example. The use of the term "example" or "for example" or "may" in the text denotes, whether explicitly stated or not, that such features or functions are present in at least the described example, whether described as an example or not, and that they can be, but are not necessarily, present in some of or all other examples. Thus "example", "for example" or "may" refers to a particular instance in a class of examples. A property of the instance can be a property of only that instance or a property of the class or a property of a sub-class of the class that includes some but not all of the instances in the class. It is therefore implicitly disclosed that a features described with reference to one example but not with reference to another example, can where possible be used in that other example but does not necessarily have to be used in that other example.

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. A method comprising:
    forming first electrode portions on a substrate;
    providing a sheet of material overlaying at least part of the first electrode portions;
    forming second electrode portions on a superstrate;
    positioning the superstrate overlaying the substrate so that the second electrode portions are aligned with the first electrode portions; and
    laminating the substrate and the superstrate together so that the sheet of material is positioned between the aligned first electrode portions and the second electrode portions;
    wherein the first electrode portions and/or the second electrode portions are formed to have an uneven surface to reduce resistance to the material.

2. A method as claimed in claim 1 wherein the uneven surface comprises a plurality of indents.

3. A method as claimed in claim 1 further comprising adding a layer of metal nanostructures to the uneven surface.

4. A method as claimed in claim 1 further comprising etching the uneven surface.

5. A method as claimed in claim 1 wherein the sheet of material comprises graphene.

6. A method as claimed in claim 1 wherein the sheet of material is functionalised with quantum dots.

7. A method as claimed in claim 1 wherein the first electrode portions and the second electrode portions are galvanically connected.

8. A method as claimed in claim 7 wherein the uneven surface enables the first electrode portions and/or the second electrode portions to at least partially puncture through the sheet of material.

9. A method as claimed in claim 1 further comprising forming electrical connections to the first electrode portions on the substrate.

10. A method as claimed in claim 1 wherein the electrode portions are configured to provide a source electrode and a drain electrode.

11. A method as claimed in claim 1 wherein the electrode portions are configured to provide a plurality of source and drain electrodes.

12. A method as claimed in claim 11 wherein the material is provided as a continuous sheet between the plurality of source and drain electrodes.

13. A method as claimed in claim 1 further comprising forming a gate electrode within the substrate.

14. A method as claimed in claim 1 wherein the electrode portions and the material form a field effect transistor.

15. A method as claimed in claim 1 wherein the electrode portions are arranged so that a first electrode is enclosed by a second electrode.

16. A method as claimed in claim 1 wherein the superstrate provides an encapsulation layer.

17. A method as claimed in claim 1 wherein the superstrate comprises a scintillator.

18. A method for the manufacture of an apparatus, the method comprising:
    forming first electrode portions on a substrate;
    providing a sheet of material overlaying at least part of the first electrode portions;
    forming second electrode portions on a superstrate;
    positioning the superstrate overlaying the substrate so that the second electrode portions are aligned with the first electrode portions; and
    laminating the substrate and the superstrate together so that the sheet of material is positioned between the aligned first electrode portions and the second electrode portions;
    wherein the first electrode portions and/or the second electrode portions are formed to have an uneven surface to reduce resistance to the material.

19. An apparatus comprising:
first electrode portions on a substrate;
a sheet of material overlaying at least part of the first electrode portions;
second electrode portions on a superstrate;
wherein the superstrate is positioned overlaying the substrate so that the second electrode portions are aligned with the first electrode portions;
wherein the substrate and the superstrate are laminated together so that the sheet of material is positioned between the aligned first electrode portions and the second electrode portions; and
wherein the first electrode portions and/or the second electrode portions are formed to have an uneven surface to reduce resistance to the material.

20. An apparatus as claimed in claim 19 wherein the uneven surface comprises a plurality of indents.

* * * * *